US010811214B2

United States Patent
Blake et al.

(12) United States Patent
(10) Patent No.: US 10,811,214 B2
(45) Date of Patent: Oct. 20, 2020

(54) LOW EMISSION CLADDING AND ION IMPLANTER

(71) Applicant: APPLIED Materials, Inc., Santa Clara, CA (US)

(72) Inventors: Julian G. Blake, Gloucester, MA (US); Frank Sinclair, Boston, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/415,255

(22) Filed: May 17, 2019

(65) Prior Publication Data

US 2020/0234910 A1 Jul. 23, 2020

Related U.S. Application Data

(63) Continuation-in-part of application No. 16/251,814, filed on Jan. 18, 2019.

(51) Int. Cl.
*H01J 37/09* (2006.01)
*H01J 37/317* (2006.01)

(52) U.S. Cl.
CPC .......... *H01J 37/09* (2013.01); *H01J 37/3171* (2013.01); *H01J 2237/0213* (2013.01); *H01J 2237/0473* (2013.01)

(58) Field of Classification Search
USPC ....................................................... 250/492.3
See application file for complete search history.

(56) References Cited

U.S. PATENT DOCUMENTS

| | | | | |
|---|---|---|---|---|
| 5,947,053 | A * | 9/1999 | Burnham | G01N 17/00 116/208 |
| 6,608,315 | B1 * | 8/2003 | Saadatmand | H01J 37/3171 250/492.21 |
| 7,436,932 | B2 * | 10/2008 | Clayton | G01N 23/005 378/119 |
| 7,560,712 | B2 * | 7/2009 | Kim | H01J 37/32082 156/345.39 |
| 9,437,397 | B2 * | 9/2016 | Blake | C23C 16/50 |
| 10,689,752 | B2 * | 6/2020 | Kirkwood | C23C 14/48 |
| 2010/0140508 | A1 | 6/2010 | Blake et al. | |
| 2015/0279612 | A1 | 10/2015 | Yagita | |
| 2018/0350559 | A1 | 12/2018 | Matsushita et al. | |

FOREIGN PATENT DOCUMENTS

| | | | |
|---|---|---|---|
| WO | 2017223130 | A1 | 12/2017 |

OTHER PUBLICATIONS

International Search Report and Written Opinion for the International Patent Application No. PCT/US2019/064691, dated Mar. 26, 2020, 9 pages.

"Radiation Issues Surrounding Very High Energy Ion Implantation", Nicholas R. White, Nobuhiro Tokoro, and Edward Bell, AIP Conference Proceedings 1066, 277 (2008), 5 pages.

* cited by examiner

*Primary Examiner* — Phillip A Johnston

(57) ABSTRACT

An ion implanter. The ion implanter may include a beamline, the beamline defining an inner wall, surrounding a cavity, the cavity arranged to conduct an ion beam. The ion implanter may also include a low emission insert, disposed on the inner wall, and further comprising a $^{12}C$ layer, the $^{12}C$ layer having an outer surface, facing the cavity.

18 Claims, 3 Drawing Sheets

MASS ANALYZER 120
ELECTROSTATIC LENS 130
TANDEM ACCELERATOR 140
CORRECTOR MAGNET 150
EXTRACTION ASSEMBLY 108
ION SOURCE CHAMBER 104
145 194 200 200 192 180 190 200 170 196 100

LOW EMISSION CLADDING AND ION IMPLANTER

RELATED APPLICATIONS

The application is a continuation-in-part and claims priority to U.S. Non-Provisional patent application Ser. No. 16/251,814, filed Jan. 18, 2019, entitled LOW EMISSION CLADDING AND ION IMPLANTER, and incorporated by reference herein in its entirety.

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter employs a so-called tandem acceleration architecture where ions are accelerated through a first column to high energy, undergo charge exchange to change polarity, and then are accelerated to a second energy, approximately double the first energy in a second column. Another type of high energy ion implanter is termed linear accelerator, or LINAC, where a series of electrodes arranged as tubes conduct and accelerate the ion beam to increasingly higher energy along the succession of tubes, where the electrodes receive an RF voltage signal at radio frequencies.

When high energy ions strike surfaces within a beamline, sputtering of material from the surfaces may take place, as well as emission of high energy species, including gamma rays, x-rays, and neutrons. To prevent sputtering of material from the beamline that may be incorporated as contaminants in a substrate to be implanted, the beamline may be lined with a material such as graphite, whose sputter product includes carbon or volatile carbon gases. To prevent excess radiation emission from a beamline, cladding, such as lead cladding may be used in implanters to absorb X-rays and gamma rays. Notably, when ion energy exceeds 1 MeV, and especially above 3 MeV, emission of neutrons may increase dramatically when such ions strike a graphite cladding or liner. This circumstance arises because ions having ion energy above 1 MeV or so may cause radioactive emission of neutrons from the carbon 13 isotope ($^{13}C$), found naturally in carbon material at a concentration in excess of 1%. To absorb neutrons emitted in such a radioactive process, very thick cladding, such a lead may be necessary. Accordingly, the cost of building a commercial ion implanter for operation in the range of 3 MeV or greater may be prohibitive (depending upon, ion specie, beam current, energy, and allowable neutron radiation levels).

BRIEF SUMMARY

In one embodiment, an ion implanter may include a beamline, the beamline defining an inner wall, surrounding a cavity, the cavity arranged to conduct an ion beam; and a low emission insert, disposed on the inner wall, and further comprising a $^{12}C$ layer, the $^{12}C$ layer having an outer surface, facing the cavity.

In a further embodiment, a method for treating an ion beam in an ion implanter, may include extracting the ion beam from an ion source in the ion implanter. The method may also include accelerating the ion beam to a high ion energy along a beamline of the ion implanter, the high ion energy comprises an energy of at least 3 MeV, in a downstream portion of the beamline. The method may also include intercepting the ion beam using a low emission insert on an inner wall of a cavity of the beamline in at least one region of the downstream portion, wherein the low emission insert comprising a $^{12}C$ layer, the $^{12}C$ layer having an outer surface, facing the cavity.

In an additional embodiment, a low emission insert for an ion implanter, may include a carbon layer, the carbon layer comprising an isotopically mixed carbon material, having a first thickness of 1 mm to 5 mm; and a $^{12}C$ layer, disposed on the carbon layer, the $^{12}C$ layer, having a second thickness of 10 μm to 5 mm.

Figure 1:
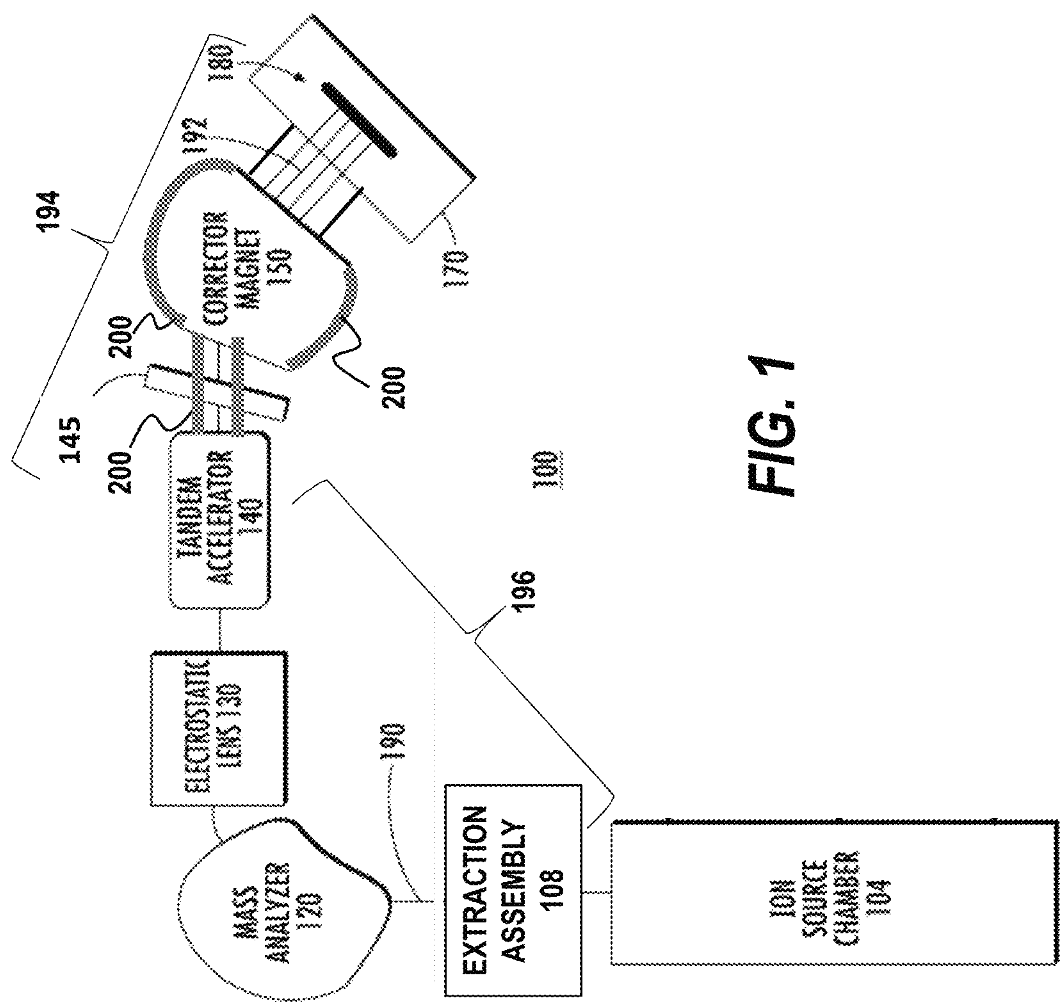
FIG. 1 shows an exemplary embodiment demonstrating an ion implanter, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems, based upon a beamline architecture. For brevity, an ion implantation system may also be referred to herein as an "ion implanter." Various embodiments provide novel configurations for providing the capability of generating high energy ions, where the final ion energy delivered to a substrate may be 1 MeV or greater. One aspect of embodiments of the present disclosure is a novel combination of two different acceleration sub-systems, providing various advantages over known beamline architecture. In exemplary embodiments, a DC accelerator column is provided in series with a novel linear accelerator to generate a high energy ion beam in a compact beamline architecture.

FIG. 1 depicts an ion implantation system 100 arranged according to embodiments of the disclosure. The ion implantation system 100 may include an ion source 104, and extraction assembly 108, capable of generating an ion beam 190. The ion implantation system 100 may further include known components including a mass analyzer 120, for providing a mass analyzed beam by deflecting and filtering the ion beam 190. As illustrated in FIG. 1, the ion implantation system may include an electrostatic lens 130 and tandem accelerator 140. The tandem accelerator 140 may be a known tandem accelerator arranged to receive the ion beam 190 and output an accelerated ion beam 192, such as a proton beam, phosphorous beam, boron beam or other accelerated ion beam. In so doing, the energy of the ion beam 190 may be increased as in known tandem accelerators. The ion implantation system may further include a scanner 145, collimator 150 (which component may include a corrector magnet), end station 170, and substrate platen 180.

Accordingly, the ion implantation system 100 may accelerate an ion beam to an energy in excess of 1 MeV, such at least 3 MeV, at least 5 MeV, at least 7 MeV. As known, the various components of the ion implantation system 100, from ion source 104 to substrate platen 180, in addition to the housing that isolates the ion beam 190 from ambient, may be deemed to constitute a beam line. The beamline may be deemed to constitute an upstream portion 196, as well as a downstream portion 194, where the energy of the ion beam 190 in the upstream portion may be less than 1 MeV during operation of the ion implantation system 100, while the energy in the downstream portion may be greater than 1 MeV, at least under some conditions of operation. Said differently, the components in the upstream portion 196 may collectively accelerate the ion beam 190 to energies of less than 1 MeV under most or all conditions of operation, while the components in the upstream portion 196 together with components in the downstream portion may be capable of accelerating the accelerated ion beam 192 to energies greater than 1 MeV, at least under some operating conditions. The upstream portion 196 and the downstream portion 194 may define a cavity or series of cavities that conduct the ion beam 190 and accelerated ion beam 192 to the substrate platen 180, as known in the art. The cavity or cavities may be surrounded by a series of walls, collectively referred to herein as an inner wall of the beamline. As the ion beam 190 is conducted down the beamline, the energy of the ion beam 190 may continue to increase, at least through the tandem accelerator 140. As such, the accelerated ion beam 192, exiting the tandem accelerator 140, when striking surfaces of the inner wall of the beamline in the downstream portion 194, may generate higher energy species than when the ion beam 190 strikes the inner wall of the beamline at upstream portion 196.

As known in the art, the upstream portion 196 of the beamline may include a liner (not separately shown) on inner wall(s) of the beamline, such as carbon, graphite, silicon carbide, or similar material. The liner may be useful to absorb ions of a given energy when portions of the ion beam 190 strike the inner wall. The liner may be eroded when ions strike the material of the liner, yielding sputtered product, such as volatile carbon species, or volatile silicon species. Such species, even when conducted toward downstream portions of the beamline, may be relatively innocuous, and tend not to reach the substrate platen 180. Notably, any energetic radiation, such as X-rays or gamma rays, produced during beamstrike of the ion beam 190 with the inner wall in the upstream portion 196 may be absorbed by further shielding provided along the beamline, such as lead shielding. Notably, in the upstream portion 196 a carbon-containing material used for an insert or liner, such as carbon, pyrolytic graphite, silicon carbide, may be formed from isotopically impure carbon, having 1% or more $^{13}C$. This type of carbon insert be deemed a high emission insert, since neutron emission will be relatively higher if impacted by high energy ions, as compared to a pure $^{12}C$ carbon insert, where neutron emission may be zero. However, because in practice the ion energy in the upstream portion 196 may be maintained at a relatively lower energy, such as below 1 MeV, the neutron emission may nevertheless be very low, if any, when ion strikes of the high emission insert occur. Thus, a low emission insert need not be used in the upstream portion 196, potentially limiting insert costs, as compared to employing low emission inserts throughout the beamline.

In accordance with embodiments of the disclosure, the downstream portion 194 of the beamline may include a low emission insert 200, disposed on the inner wall. The low emission insert 200 may be formed of a special material and laminated or layered structure, as detailed below. In brief, the low emission insert 200 may be formed of a carbon-containing material, and may be adapted to reduce or eliminate emission of neutrons that are otherwise generated when high energy ions strike carbon. The low emission insert 200 provides a material, free from $^{13}C$, at least in portions that are impacted by the accelerated ion beam 192. As such, the low emission insert 200 may replace known carbon, graphite or silicon carbide liners used in known ion implanters. Because the low emission insert 200 may prevent emission of neutrons, in various non-limiting embodiments, the ion implantation system 100 may be operated in a safe manner at relatively high energies, where the accelerated ion beam 192 may reach ion energy in the range of 1 MeV to 8 MeV.

In various embodiment, the low emission insert 200 may be formed from amorphous carbon, diamondlike carbon, pyrolytic graphite, silicon carbide (SiC), amorphous SiC, or other carbon-containing material, or a combination of the above. Pyrolytic graphite and/or amorphous silicon carbide may be especially appropriate for use as materials for low emission insert 200, since isotopically impure versions of these materials, which impure versions include $^{13}C$, are already deployed as inserts in ion implanters.

Figure 2:
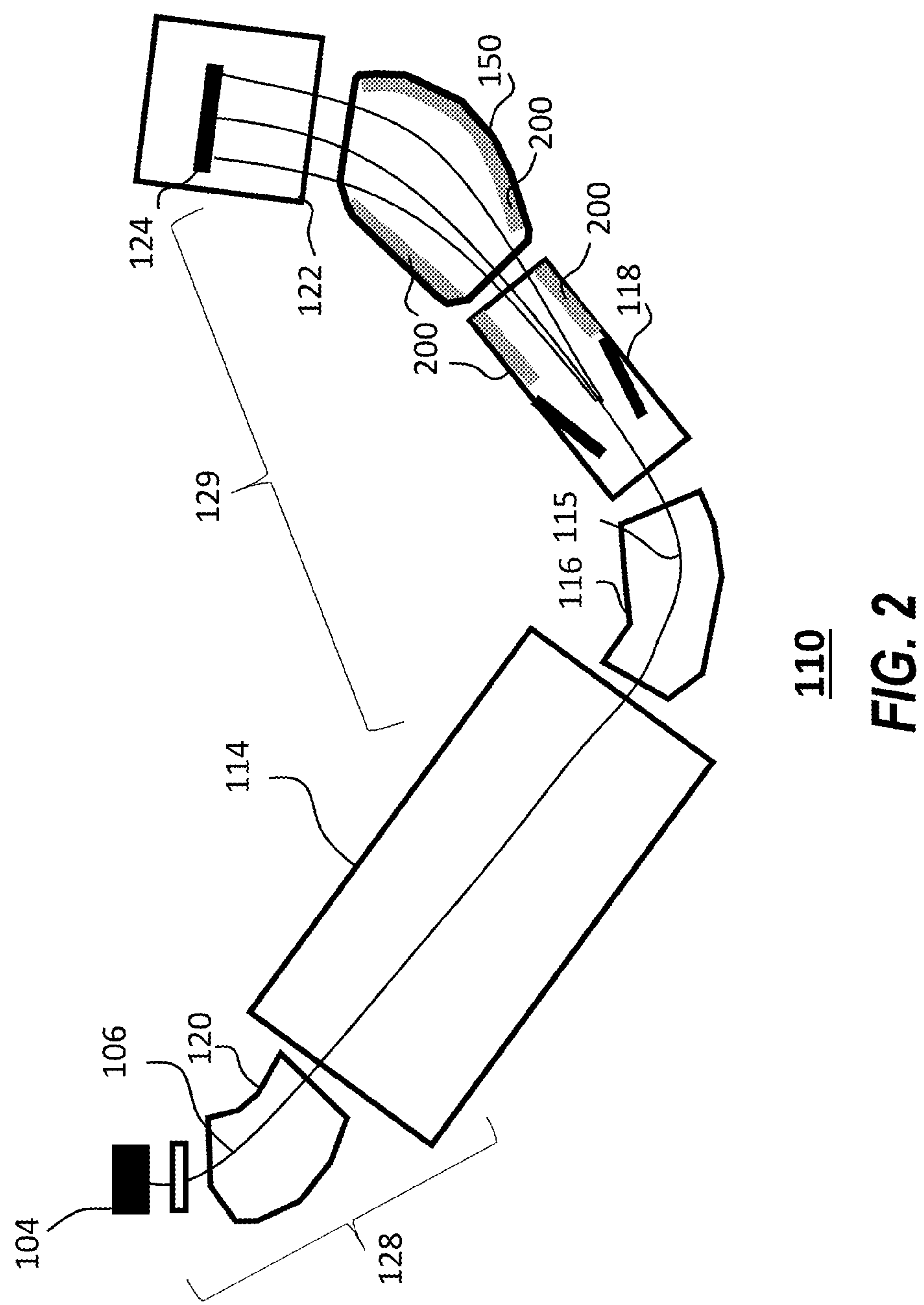
FIG. 2 shows an exemplary embodiment demonstrating another ion implanter, according to further embodiments of the disclosure.

Referring now to FIG. 2, another system is shown in block form. The system 110 may represent a beamline ion implanter, with some elements not shown for clarity of explanation. The system 110 may include similar components to the components of ion implantation system 100, where like components are labeled the same. The ion source 104 may include extraction components and filters (not shown) to generate an ion beam 106 at a first energy in an upstream portion 128 of the beamline. Examples of suitable ion energy for the first ion energy range from 5 keV to 100 keV, while the embodiments are not limited in this context. To form a high energy ion beam, the system 110 includes various additional components for accelerating the ion beam 106. The system 110 may include a mass analyzer 120, functioning to analyze the ion beam 106 as in known apparatus, by changing the trajectory of the ion beam 106, as shown. The system 110 may also include a linear accelerator 114 (shown in the dashed line), disposed downstream of the ion source 104, where the linear accelerator 114 is arranged to accelerate the ion beam 106 to form a high energy ion beam. In various embodiments, the system 110 may include additional components, such as a filter magnet 116, scanner 118, collimator 150 (which component may include a magnet), where the general functions of the scanner 118 and collimator 150 are well known and will not be described herein in further detail. As such, a high energy ion beam, represented by the high energy ion beam 115, may be delivered to an end station 122 for processing a substrate 124.

As with the ion implantation system 100, the system 110 may generate ion energies in excess of 1 MeV, such as energies ranging up to 8 MeV in some embodiments. More particularly, the system 110 may include several stages (not shown), to accelerate the ion beam 106 in increments, up to a final energy, as known in the art. As with ion implantation system 100, the system 110 may also include the low emission insert 200, on at least a portion of an inner wall of the beamline in the downstream portion 129. Thus, the low emission insert 200 may prevent emission of neutrons when the system 110 is operated at relatively high energies, where the high energy ion beam 115 may reach ion energy in the range of 1 MeV to 8 MeV.

Figure 3:
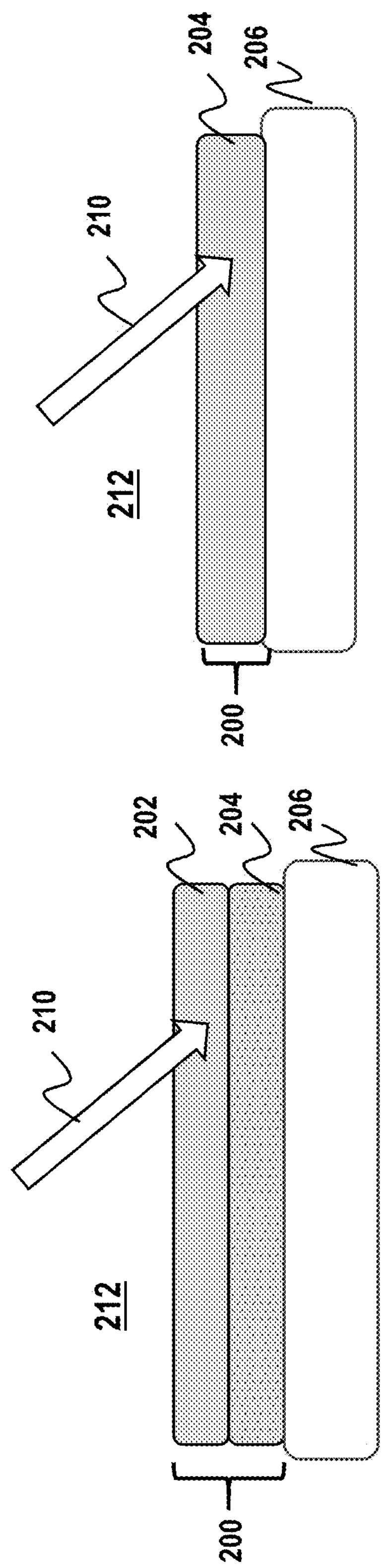

Turning to FIG. 3, there is shown a cross-sectional view of one embodiment of the low emission insert 200. In this implementation, the low emission insert 200 is disposed adjacent to a wall 206, where the upper surface of the wall 206 may represent an inner wall of a beamline. In some embodiments, the low emission insert 200 may be fastened to the wall 206. According to some embodiments, the low emission insert 200 may be reversibly fastenable to the wall 206. The low emission insert 200 may assume the shape of the wall 206, and may be arranged as a plate according to some embodiments.

As further shown in FIG. 3, the low emission insert 200 may include a $^{12}C$ layer 202, the $^{12}C$ layer 202 having a first thickness, ranging between 1 mm to 5 mm in various non-limiting embodiments. The low emission insert 200 may further include a carbon layer 204, disposed subjacent the $^{12}C$ layer 202, toward the exterior side of the $^{12}C$ layer 202 the $^{12}C$ layer 202 and in contact with the inner wall (meaning the surface of wall 206).

Depending upon the type of implantation to be performed, as well as other factors, the carbon layer 204 may have a second thickness, greater than the first thickness of the $^{12}C$ layer 202. Overall, the thickness of the low emission insert 200 may range from 1 mm or so up to 5 mm or so, in various non-limiting embodiments. The thickness of the $^{12}C$ layer 202 may be tailored according to the use of an implanter containing the low emission insert 200. One consideration for setting the thickness of the $^{12}C$ layer 202 of low emission insert 200 is the penetration depth of ions of ion beam 210. In particular, the $^{12}C$ layer 202 may be arranged with sufficient thickness to prevent ions of ion beam 210 from penetrating into the carbon layer 204. As such, for operation in a dedicated phosphorous implantation system, where ion energy does not exceed 5 MeV, the thickness of $^{12}C$ layer 202 may be less than the thickness of a $^{12}C$ layer 202 in an ion implantation system for implanting hydrogen up to 8 MeV.

In various non-limiting embodiments, the $^{12}C$ layer 202 may be isotopically pure, meaning the $^{12}C$ layer 202 does not contain any $^{13}C$ layer or contains less than a ppm of $^{13}C$. In some embodiments, the $^{12}C$ layer may be formed of pure carbon, meaning no other chemical elements are present. As such, when the ion beam 210 strikes the $^{12}C$ layer 202, carbon species may be sputtered into the beamline 212, which species may be evacuated from the system, for example, if oxidized to form volatile carbon products. Advantageously, even when the energy of ions of the ion beam 210 is in the range of 5 MeV to 8 MeV, no neutrons are produced, because $^{12}C$ does not react with such high energy species to generate neutrons. By way of reference, when ion energy of a boron ion beam increases from approximately 5 MeV to 10 MeV, emission of neutrons from a naturally occurring carbon (containing ~1% $^{13}C$) sample has been observed to increase by approximately four orders of magnitude. Thus, by eliminating $^{13}C$ exposure to the ion beam 210, the low emission insert 200 may allow safe operation up to energies (10 MeV) where known carbon inserts may emit dangerous levels of neutrons.

Figure 4:
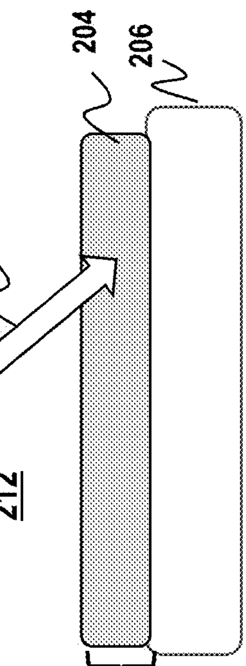
FIG. 3 and FIG. 4 present different embodiments of a low emission insert.

While the embodiment of FIG. 3 shows a bilayer configuration for the low emission insert 200, in other embodiments the low emission insert 200 may be formed of a single layer. FIG. 4 depicts an embodiment where the low emission insert 200 is formed from the $^{12}C$ layer 202, without the carbon layer 204. In this implementation, the thickness of the $^{12}C$ layer 202 may be arranged to prevent penetration to the wall 206 at the highest operating energy of the ion beam 210.

In various other embodiments, the $^{12}C$ layer 202 may be a silicon carbide layer (SiC). As such, the silicon carbide may contain isotopically pure $^{12}C$, with no $^{13}C$. Such an SiC layer may also be arranged with a thickness to prevent the ion beam 210 from striking the carbon layer 204 (in the embodiment of FIG. 3) or the wall 206 (in the embodiment of FIG. 4), as the case may be.

In accordance with various embodiments of the disclosure, the $^{12}C$ layer 202 may be a chemical vapor deposition layer. In these embodiments the $^{12}C$ layer 202 may be deposited by chemical vapor deposition (CVD) on a given substrate, such as the carbon layer 204. In some embodiments, to form the $^{12}C$ layer 202, the CVD process (CVD operation) may be used to form a pyrolytic graphite layer containing just $^{12}C$ isotope and no $^{13}C$. Chemical vapor deposition may be performed using known CVD reactors (including PECVD), according to know recipes, where the $^{12}C$ layer 202 may obtain a microstructure characteristic of the CVD process. In one specific implementation, where the $^{12}C$ layer 202 is a pure carbon layer (as opposed to SiC layer), the $^{12}C$ layer 202 may be deposited from a $^{12}CH_4$ precursor gas. Notably, isotopically pure $^{12}C$-containing precursors, such as methane or other low molecular weight hydrocarbon gases are readily commercially available to act as a source for forming the $^{12}C$ layer 202. In an embodiment where the $^{12}C$ layer 202 is an SiC layer, the $^{12}C$ layer 202 may be formed from a combination of $SiH_4$ and $^{12}CH_4$. The embodiments are not limited in this context.

In various additional embodiments, the thickness of the $^{12}C$ layer 202 may be tailored to reduce neutron emission from a cladding in an implanter, while not requiring the isotopically pure $^{12}C$ layer to have a thickness of 1 mm or greater. An advantage of providing a relatively thinner layer of $^{12}C$ is the relatively lower cost and time for preparation of the thinner layer. According to some embodiments, the $^{12}C$ layer 202 may be formed with a thickness of less than 1 mm, such as 500 μm, 200 μm, 100 μm, 50 μm, 20 μm, or 10 μm in various non-limiting embodiments. In particular embodiments where the $^{12}C$ layer 202 has a thickness less than 1 mm, the $^{12}C$ layer 202 may be arranged on a surface of the carbon layer 204, as in FIG. 3. Advantageously, the carbon layer 204 may be arranged with a relatively greater thickness, such as above 1 mm, to protect beamline components from ion impact at high energies, while the $^{12}C$ layer 202 provides a non-neutron-emitting surface layer, directly exposed to an ion beam. As such, a large reduction in neutron emission may be achieved in comparison to a known cladding having just the carbon layer 204, including $^{13}C$.

As an example, for protons (hydrogen ions) having energy of 3 MeV, the calculated range according to well-known methods is 74 μm, while at 5 MeV the calculated range is 180 μm, and at 8 MeV is 400 μm According to these calculations, a 100 μm thick layer of $^{12}C$, disposed over a cladding of isotopically impure carbon, may absorb some fraction of protons at 5 MeV an even larger fraction of the protons at 3 MeV, wherein the neutron dose emitted from the cladding (that is, from the underlying impure carbon layer) may be reduced by an order of magnitude.

Moreover, for B ions, the calculated range in graphite at 8 MeV is approximately 7 μm, at 5 MeV is 4.3 μm, and at 3 MeV is 3 μm. Thus, 10 μm thick layer of $^{12}C$, disposed over a cladding of isotopically impure carbon, may absorb a large fraction of boron ions, even at 8 MeV, such that the neutron dose emitted from the cladding (that is, from the underlying impure carbon layer) may be reduced by more than an order of magnitude.

In embodiments where the low emission insert 200 is to have a curved shape, adapted to conform to an inner surface or inner wall of an ion implanter, the carbon layer 204 may be provided as a curved substrate, while the $^{12}C$ layer 202 is deposited on the carbon layer 204 in a CVD process to form a conformal coating on the carbon layer.

While in some embodiments the carbon layer 204 may be pure carbon (or graphite), in other embodiments, the carbon layer 204 may be SiC.

Figure 5:
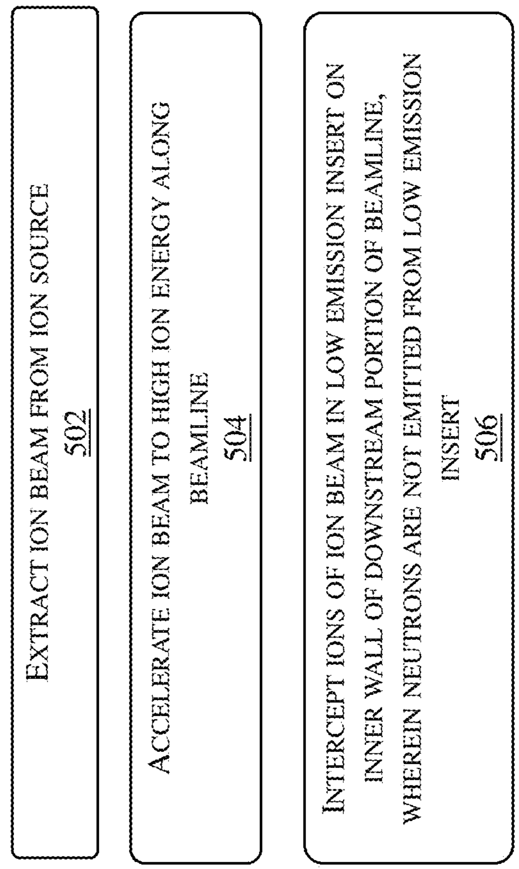
FIG. 5 depicts an exemplary process flow according to some embodiments of the disclosure.

FIG. 5 depicts an exemplary process flow 500 according to some embodiments of the disclosure. At block 502, an ion beam is generated from an ion source. The ion source may be located in a beamline of an ion implanter. The ion beam may be extracted at a first energy between 5 keV and 100 keV in some embodiments. At block 504 the ion beam is accelerated to a high energy along the beamline. The high energy may range above 1 MeV, above 3 MeV, above 5 MeV, up to 10 MeV in various embodiments. As an example, the ion implanter may be a tandem accelerator, arranged to accelerate boron ions, hydrogen ions, or phosphorous ions. The embodiments are not limited in this context. In additional embodiments, the ion implanter may be a linear accelerator, capable of accelerating ions to ion energy in the range of 1 MeV to 10 MeV. As such, after acceleration through a tandem accelerator or linear accelerator, the ion beam may emerge in a downstream portion of the beamline with the high energy, in the range of 1 MeV to 10 MeV.

At block 506, the ions of the ion beam, having attained the high ion energy, are intercepted by a low emission insert, disposed on an inner wall of the downstream portion of the beamline. The low emission insert on the inner wall may be located in various regions, including within components such as a collimator. The low emission insert may be arranged with a carbon-containing material, such as graphite, carbon, silicon carbide, in some embodiments. As such, when the ions are intercepted, the low emission insert may emit into the beamline sputtered particles such as carbon, silicon, or volatile products of carbon and silicon, without other species. According to various embodiments, the low emission insert may be arranged with the appropriate thickness to contain the ion beam, even at a highest energy, such as 10 MeV. According to various embodiments, the carbon containing material may include isotopically pure carbon made of pure $^{12}C$, with no $^{13}C$. As such when the high ion energy ions are intercepted in the low emission insert, neutrons are not emitted from low emission insert, since no $^{13}C$ is present, and the $^{12}C$ material of the low emission insert is not capable of generating neutrons upon impact with the high energy ions.

In view of the foregoing, at least the following advantages are achieved by the embodiments disclosed herein. For a first advantage, by providing an isotopically pure $^{12}C$-containing insert along select portions of a beamline, a high energy implanter, capable of operating in the energy range above 1 MeV, may be constructed so as not to be susceptible to neutron generation. As a second advantage, a high energy implanter may be constructed without the need for thick neutron-absorbing layers, otherwise needed to ensure safe operation at high energies above ~1 MeV where neutron generation from carbon-containing liners becomes significant.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An ion implanter, comprising:

a beamline, the beamline defining an inner wall, surrounding a cavity, the cavity arranged to conduct an ion beam; and a low emission insert, disposed on the inner wall, and further comprising a $^{12}C$ layer, the $^{12}C$ layer having an outer surface, facing the cavity, wherein the low emission insert is located in a downstream portion of the ion implanter, the downstream portion of the ion implanter comprising at least a portion of a tandem accelerator or a linear accelerator, as well as a set of beamline components disposed downstream of the tandem accelerator, or downstream of the linear accelerator, and wherein the low emission insert is not disposed in an upstream portion of the beamline, comprising components of the beamline disposed upstream of the tandem accelerator, or upstream of the linear accelerator.

2. The ion implanter of claim 1, the low emission insert further comprising a carbon layer, disposed subjacent the $^{12}C$ layer and to an exterior side of the $^{12}C$ layer, wherein the carbon layer is disposed in contact with the inner wall.

3. The ion implanter of claim 1, the $^{12}C$ layer comprising pure carbon, in the having a form of diamondlike carbon, amorphous carbon, or pyrolytic graphite.

4. The ion implanter of claim 1, the $^{12}C$ layer comprising silicon carbide.

5. The ion implanter of claim 1, the $^{12}C$ layer further comprising a chemical vapor deposition layer, and having a shape adapted to conform to an inner surface of the ion implanter.

6. The ion implanter of claim 1, wherein the ion implanter is arranged to generate an ion energy of at least 1 MeV in the downstream portion of the beamline, and not in the upstream portion of the beamline, and wherein a high emission insert is disposed in the upstream portion of the beamline, the high emission insert comprising an isotopically mixed carbon material.

7. The ion implanter of claim 1, the $^{12}C$ layer having a thickness of 10 μm to 5 mm.

8. The ion implanter of claim 7, the $^{12}C$ layer comprising a thickness of 1 mm or less, wherein the low emission insert further comprises a carbon layer, disposed subjacent the $^{12}C$ layer and immediately adjacent the inner wall, wherein the carbon layer has a thickness of 1 mm or more.

9. A method of treating an ion beam in an ion implanter, comprising:

extracting the ion beam from an ion source in the ion implanter;

accelerating the ion beam to a high ion energy along a beamline of the ion implanter, the high ion energy comprises an energy of at least 1 MeV, in a downstream portion of the beamline; and intercepting the ion beam using a low emission insert on an inner wall of a cavity of the beamline in at least one region of the downstream portion, the downstream portion of the ion implanter comprising at least a portion of a tandem accelerator or a linear accelerator, as well as a set of beamline components disposed downstream of the tandem accelerator, or downstream of the linear accelerator, wherein the low emission insert is not disposed in an upstream portion of the beamline, comprising components of the beamline disposed upstream of the tandem accelerator, or upstream of the linear accelerator, and wherein the low emission insert comprising a $^{12}C$ layer, the $^{12}C$ layer having an outer surface, facing the cavity, wherein the low emission insert is not in an upstream portion of the beamline, comprising components of the beamline disposed upstream of the tandem accelerator, or upstream of the linear accelerator.

10. The method of claim 9, the low emission insert further comprising a carbon layer, disposed subjacent the $^{12}C$ layer and to an exterior side of the $^{12}C$ layer, wherein the carbon layer is disposed in contact with the inner wall.

11. The method of claim 9, the $^{12}C$ layer comprising pure carbon or silicon carbide.

12. The method of claim 9, the $^{12}C$ layer being formed by performing a chemical vapor deposition (CVD) operation.

13. The method of claim 12, the performing the CVD operation comprising:

providing a carbon layer, the carbon layer comprising an isotopically impure carbon; and performing a CVD process to deposit the $^{12}C$ layer on the carbon layer.

14. The method of claim 9, the high ion energy ranging up to 8 MeV.

15. The method of claim 9, wherein the ion implanter is arranged to generate the high ion energy in the downstream portion of the beamline, and not in the upstream portion of the beamline, and wherein a high emission insert is disposed in the upstream portion of the beamline, the high emission insert comprising an isotopically mixed carbon material.

16. The method of claim 10, the $^{12}C$ layer having a thickness of 10 μm to 5 mm, wherein the carbon layer has a thickness of 1 mm or more.

17. A low emission insert for an ion implanter, comprising:

a carbon layer, the carbon layer comprising an isotopically mixed carbon material, having a first thickness of 1 mm to 5 mm; and a $^{12}C$ layer, disposed on the carbon layer, the $^{12}C$ layer, having a second thickness of 20 μm to 5 mm.

18. The low emission insert of claim 17, wherein the $^{12}C$ layer comprising pure carbon or silicon carbide.

* * * * *